US009859493B2

(12) United States Patent
Kim et al.

(10) Patent No.: US 9,859,493 B2
(45) Date of Patent: *Jan. 2, 2018

(54) VARIABLE RESISTANCE MEMORY DEVICE AND METHOD OF MANUFACTURING THE SAME

(71) Applicant: SK hynix Inc., Gyeonggi-do (KR)

(72) Inventors: Min Seok Kim, Gyeonggi-do (KR); Hyo Seob Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/094,110

(22) Filed: Apr. 8, 2016

(65) Prior Publication Data
US 2016/0225989 A1    Aug. 4, 2016

Related U.S. Application Data

(63) Continuation of application No. 14/046,403, filed on Oct. 4, 2013, now Pat. No. 9,337,420.

(30) Foreign Application Priority Data

Jun. 21, 2013    (KR) .................. 10-2013-0071496

(51) Int. Cl.
H01L 45/00    (2006.01)
(52) U.S. Cl.
CPC .......... H01L 45/1683 (2013.01); H01L 45/06 (2013.01); H01L 45/1233 (2013.01);
(Continued)
(58) Field of Classification Search
CPC . H01L 45/1683; H01L 45/1233; H01L 45/06; H01L 45/1246; H01L 45/144; H01L 45/1675; H01L 45/122; H01L 45/1253
(Continued)

(56) References Cited

U.S. PATENT DOCUMENTS 8,933,430 B1    1/2015  Jung et al.
9,190,613 B2   11/2015  Jung et al.
(Continued)

FOREIGN PATENT DOCUMENTS

CN    102468436    5/2012
JP    2010-161376    7/2010
(Continued)

OTHER PUBLICATIONS

Office Action issued by the United States Patent and Trademark Office for U.S. Appl. No. 15/094,151 in the same family tree dated Jul. 21, 2017.

(Continued)

Primary Examiner — Joseph C. Nicely
Assistant Examiner — Pavel Ivanov
(74) Attorney, Agent, or Firm — IP & T Group LLP

(57) ABSTRACT

A variable resistance memory device and a method of manufacturing the same are provided. The variable resistance memory device may include a multi-layered insulating layer formed on a semiconductor substrate, on which a lower electrode is formed. The multi-layered insulating layer may include a first hole and a second hole, concentrically formed therein, to expose the lower electrode, wherein a diameter of the first hole is larger than a diameter of the second hole. A variable resistance material layer may be formed in the second hole to contact the lower electrode, and an upper electrode may be formed in the first hole to contact the variable resistance material layer.

9 Claims, 6 Drawing Sheets

(52) U.S. Cl.
CPC ........ *H01L 45/1246* (2013.01); *H01L 45/144* (2013.01); *H01L 45/1675* (2013.01)

(58) Field of Classification Search
USPC .............................................. 257/3; 438/382
See application file for complete search history.

(56) References Cited

U.S. PATENT DOCUMENTS

| | | | |
|---|---|---|---|
| 2007/0054448 A1 | 3/2007 | Choi et al. | |
| 2008/0138931 A1* | 6/2008 | Lung ...................... | H01L 45/04 438/102 |
| 2008/0265238 A1 | 10/2008 | Chen et al. | |
| 2010/0072446 A1 | 3/2010 | Kim et al. | |
| 2010/0078621 A1* | 4/2010 | Breitwisch .............. | H01L 45/06 257/4 |
| 2011/0057162 A1* | 3/2011 | Breitwisch .............. | H01L 45/06 257/3 |
| 2011/0284815 A1 | 11/2011 | Kim et al. | |
| 2012/0025162 A1* | 2/2012 | Shin .................... | H01L 27/2409 257/3 |
| 2013/0112935 A1 | 5/2013 | Himeno et al. | |
| 2013/0240820 A1* | 9/2013 | Shin ........................ | H01L 45/06 257/3 |

FOREIGN PATENT DOCUMENTS

| | | |
|---|---|---|
| TW | 201143084 | 12/2012 |
| WO | WO 2012/074131 | 6/2012 |
| WO | WO 2012073503 | 6/2012 |

OTHER PUBLICATIONS

Office Action issued by the United States Patent and Trademark Office for U.S. Appl. No. 15/094,151 in the same family tree dated Nov. 1, 2017.

* cited by examiner

VARIABLE RESISTANCE MEMORY DEVICE AND METHOD OF MANUFACTURING THE SAME

CROSS-REFERENCES TO RELATED APPLICATION

This application is a continuation of U.S. patent application Ser. No. 14/046,403 filed on Oct. 4, 2013, which claims priority under 35 U.S.C. 119(a) to Korean application number 10-2013-0071496, filed on Jun. 21, 2013, in the Korean Patent Office. The disclosure of each of the foregoing applications is incorporated by reference in its entirety.

BACKGROUND OF THE INVENTION

1. Technical Field

Various implementations relate to a nonvolatile memory device, and more particularly, to a variable resistance memory device and a method of manufacturing the same.

2. Related Art

In recent years, with demands on semiconductor devices with high performance and low power, next generation semiconductor memory devices with non-volatility and non-refresh have been researched. As one of the next-generation semiconductor memory devices, variable resistance memory devices are suggested, and there are phase-change random access memory devices (PCRAMs), resistive RAMs (ReRAMs), magnetic RAMs (MRAMs), spin-transfer torque magnetoresistive RAMs (STTMRAMs), or polymer RAMs (PoRAMs), as the variable resistance memory devices.

The variable resistance memory devices perform a memory operation to have a set state or a reset state by controlling a phase-change material, which constitutes a data storage unit, to a crystalline state or an amorphous state.

Attempts to reduce a reset current, that is, a current required to switch a phase-change material to an amorphous state in PCRAMs have been made. Reduction in the reset current of the PCRAMs may be determined by a resistance of the phase-change material layer and a contact area between a lower electrode and the phase-change material layer.

Thus, at present, attempts to reduce the contact area between the lower electrode and the phase-change material layer, which can be controlled by a process, have been made increasingly.

SUMMARY

Various implementations are provided to a variable resistance memory device capable of reducing a reset current, and a method of manufacturing the same.

In an exemplary implementation, there is provided an exemplary variable resistance memory device. The exemplary variable resistance memory device may include: a multi-layered insulating layer formed on a semiconductor substrate, on which a lower electrode is formed, the multi-layered insulating layer including a first hole and a second hole, concentrically formed therein, to expose the lower electrode, wherein a diameter of the first hole is larger than a diameter of the second hole; a variable resistance material layer formed in the second hole to contact the lower electrode; and an upper electrode formed in the first hole to contact the variable resistance material layer.

In an implementation, there is provided an exemplary method of manufacturing a variable resistance memory device. The exemplary method may include: forming a multi-layered insulating layer by alternately forming a first insulating layer and a second insulating layer on a semiconductor substrate, on which a lower electrode is formed; forming a first hole exposing the lower electrode by etching the multi-layered insulating layer; forming an oxide layer by oxidizing a portion of the second insulating layer; removing the oxide layer so that the first insulating layer protrudes toward the inside of the first hole forming a spacer material, including a void, in the first hole; forming a second hole, exposing the lower electrode, by removing a portion of the spacer material to a certain depth of the first hole; forming a variable resistance material layer in the second hole; and forming an upper electrode in a portion of the first hole from which the spacer material has been removed.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
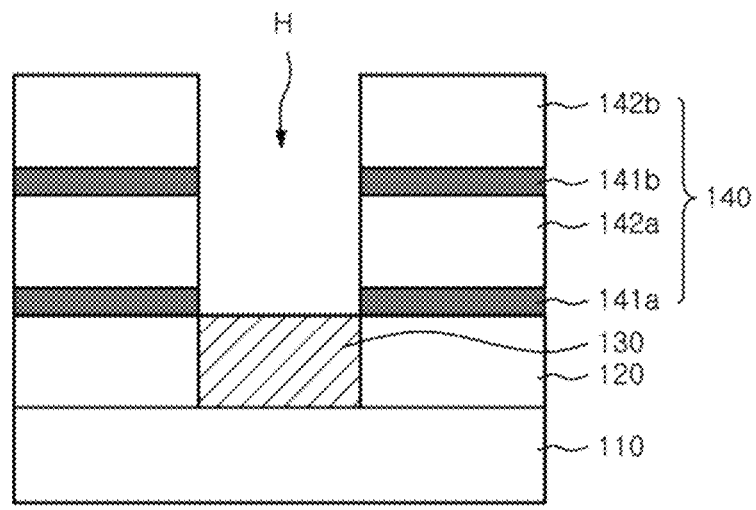
FIGS. 1 to 6 are views illustrating an exemplary method of manufacturing a variable resistance memory device.

Hereinafter, exemplary implementations will be described in greater detail with reference to the accompanying drawings, Exemplary implementations are described herein with reference to cross-sectional illustrations that are schematic illustrations of exemplary implementations and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIGS. 1 to 6 are views illustrating a method of manufacturing a variable resistance memory device according to an implementation of the inventive concept.

As illustrated in FIG. 1, a first interlayer insulating layer 120 may be formed on a semiconductor substrate 110, and a hole (not shown) may be formed in, the first interlayer insulating layer 120. A conductive material may be buried in the inside of the hole to form a lower electrode 130. In an exemplary implementation although not shown, the semiconductor substrate 110 may include a word line and a switching device. A second interlayer insulating layer 140 may be formed on the first interlayer insulating layer 120, in which the lower electrode 130 is formed. Here the second interlayer insulating layer 140 may be a multi-layered insulating layer in which first material layers 141a and 141b and the second material layers 142a and 142b are alternately stacked. For example, the first material layers 141a and 141b may a include nitride, and the second material layers 142a and 142b may include polysilicon. A resistance change region H exposing an upper surface of the lower electrode 130 is formed in the second interlayer insulating layer 140.

Figure 2:
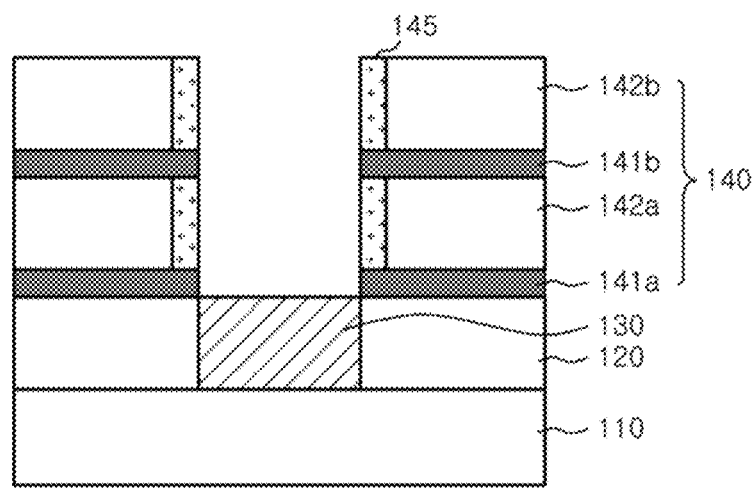

As illustrated in FIG. 2, portions of the second material layers 142a and 142b, which define an outer sidewall of the resistance change region H, may be oxidized to form a sacrificial oxide layer 145.

Figure 3:
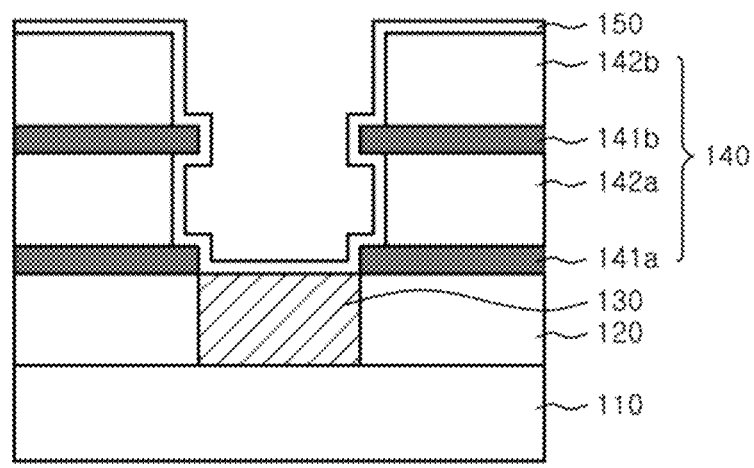

As illustrated in FIG. 3, the sacrificial oxide layer 145 may be etched. An oxide layer 150 may then be deposited along a surface of the resistance change region H and along an upper surface of the second interlayer insulating layer 140. The oxide layer 150 may protect the second material layers 142a and 142b, which define the outer sidewall of the resistance change region H, and prevent leakage. The oxide layer 150 may be deposited, for example, via an atomic layer deposition (ALD) method.

Figure 4:
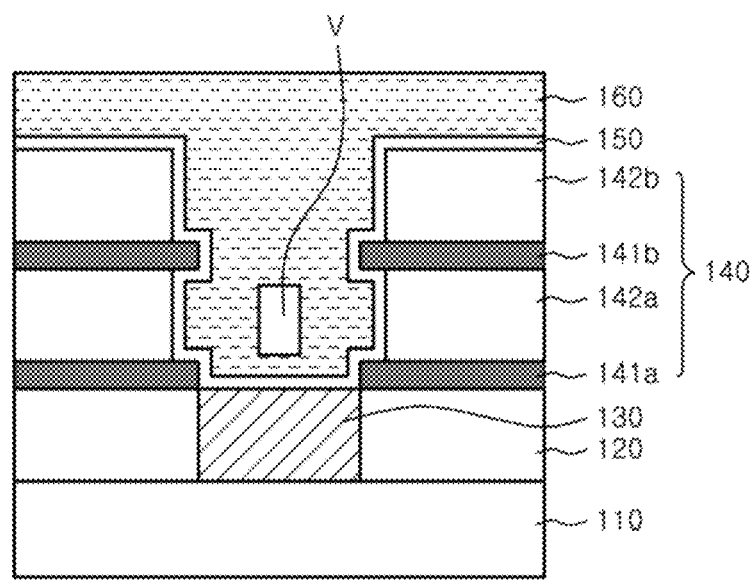

As illustrated in FIG. 4, a spacer material 160 may be formed in the resistance change region H. Since only the second material layers 142a and 142b of the second interlayer insulating layer 140 are oxidized and then etched, the first material layers 141a and 141b of the second interlayer insulating layer 140 have a form protruding toward the inside of the resistance change region H. At this time, because the resistance change region H has a structure in which the protrusion, the buring of the spacer material 160 is not easy. Therefore, the spacer material 160 may be formed in a state in which the spacer material 160 is not completely buried in the inside of the resistance change region H, and a void V is generated in the inside of the resistance change region H. The void V may be generated by a physical shape of the resistance change region H, and a size of the void V may be controlled according to a degree of protrusion of the first material layers 141a and 141b of the second interlayer insulating layer 140. For example, the protrusion of the first material layers 141a and 141b of the second interlayer insulating layer 140 is increased, the size of the void V may be increased. That is, according to a width of oxidation of the second material layers 142a and 142b. The spacer material 160 may include, for example, a nitride.

Figure 5:
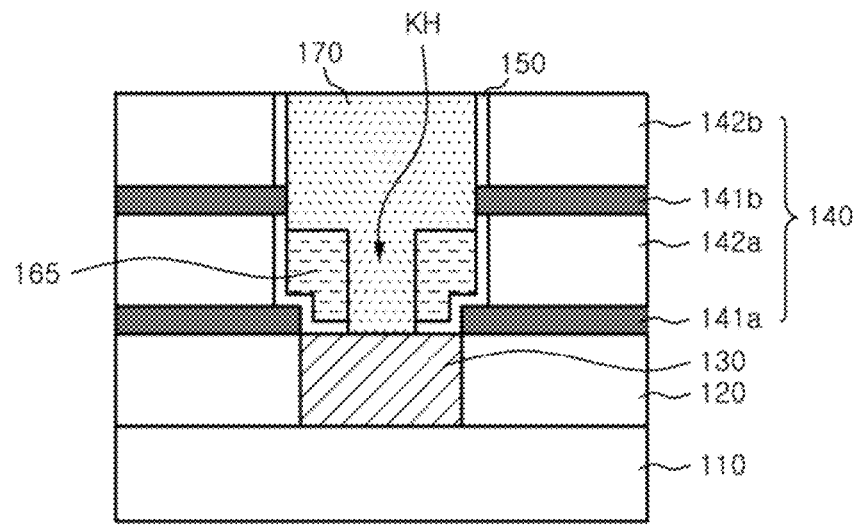

As illustrated in FIG. 5, the spacer material 160 may be etched to a certain height inside of the resistance change region H to form a spacer 165. When a portion of the spacer material 160 is etched, an etching gas, for example $CH_3F$ gas and $O_2$ plasma gas may be used. The etching gas may be transferred into the void V and the spacer material 160 below the void V is also etched to form a key hole KH exposing the lower electrode 130. A variable resistance material 170 may be formed in the key hole KH and the resistance change region H. The variable resistance material 170 may include, for example, $Ge_2Sb_2Te_5$ (GST).

Figure 6:
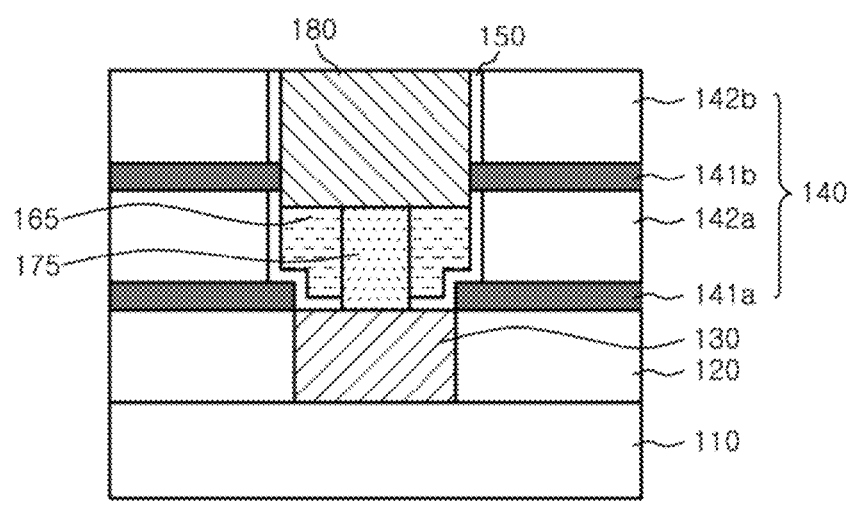

As illustrated in FIG. 6, the variable resistance material 170 may be etched so as to remain only in the key hole KH to form a variable resistance layer 175. An upper electrode 180 may be formed on the variable resistance layer 175 by forming a conductive material in the resistance change region H.

FIGS. 7 to 12 are views illustrating an exemplary method of manufacturing a variable resistance memory device.

Figure 7:
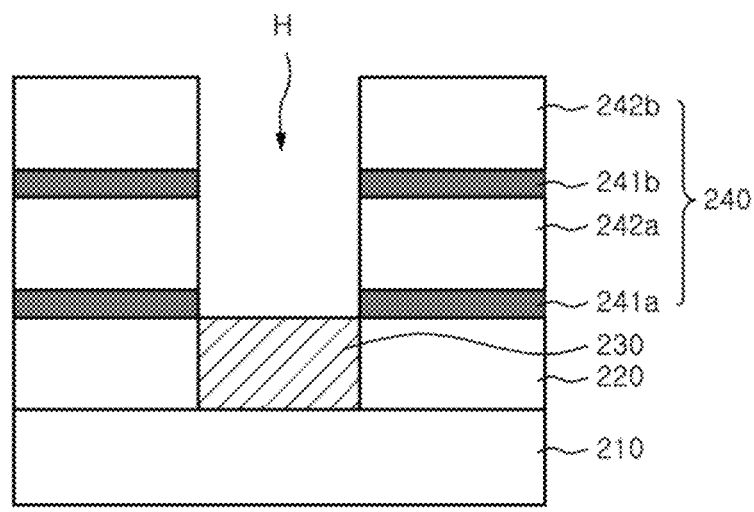
FIGS. 7 to 12 are views illustrating an exemplary method of manufacturing a variable resistance memory device.

As illustrated in FIG. 7, a first interlayer insulating layer 220 may be formed on a semiconductor substrate 210, and a hole (not shown) may be formed in the first interlayer insulating layer 220. A conductive material is buried in the inside of the hole to form a lower electrode 230. In an exemplary implementation, although not shown, the semiconductor substrate 210 may include a word line and a switching device. A second interlayer insulating layer 240 is formed on the first interlayer insulating layer 220, in which the lower electrode 230 is formed. Here, the second interlayer insulating layer 240 may be a multi-layered insulating layer in which first material layers 241a and 241b and the second material layers 242a and 242b are alternately stacked. For example, the first material layers 241a and 241b may include a nitride, and the second material layers 242a and 242b may include polysilicon. A resistance change region H exposing an upper surface of the lower electrode 230 is formed in the second interlayer insulating layer 240.

Figure 8:
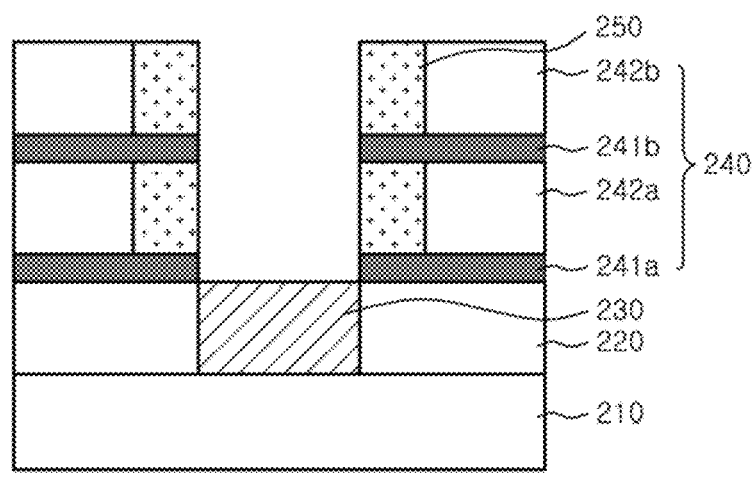

As illustrated in FIG. 8, portions of the second material layers 242a and 242b, which define an outer sidewall of the resistance change region H, may be oxidized to form an oxide buffer layer 250. As compared to FIG. 2, the oxide buffer layer 250 may be formed to have a larger width than the sacrificial oxide layer 145 formed in FIG. 2.

Figure 9:
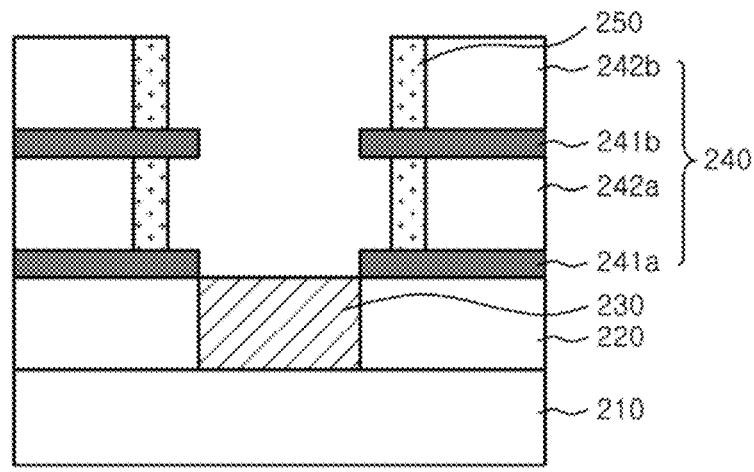

As illustrated in FIG. 9, a portion of the oxide buffer layer 250 may be etched. When the portion of the oxide buffer layer 250 is etched, portions of the first material layers 241a and 241b of the second interlayer insulating layer 240 protrude toward the inside of the resistance change region H.

Figure 10:
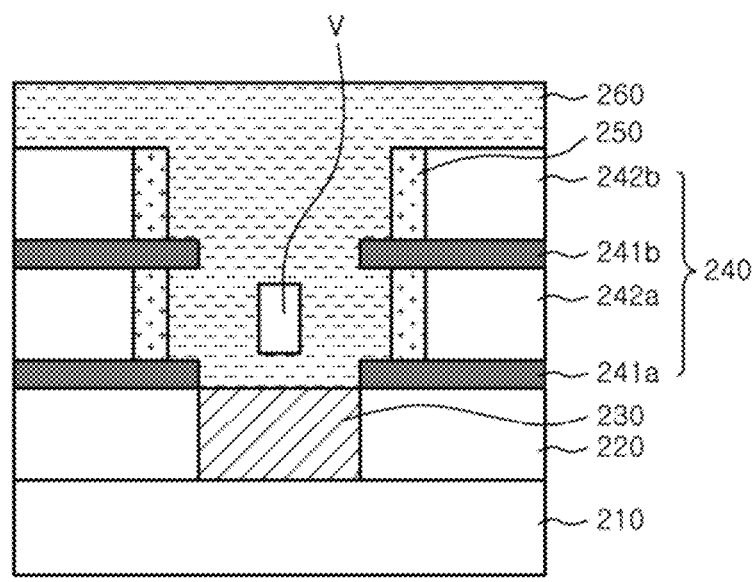

As illustrated in FIG. 10, a spacer material 260 may be formed in the resistance change region H. The first material layers 241a and 241b of the second interlayer insulating layer 240 protrude toward the inside of the resistance change region H. At this time, because the resistance change region H has a structure in which the protrusion, the buring of the spacer material 160 is not easy. Therefore, the spacer material 260 may be formed in a state in which the spacer material 260 is not completely buried in the inside of the resistance change region H, and a void V is generated in the inside of the resistance change region 11. The void V may be generated by a physical shape of the resistance change region H, and a size of the void V may be controlled according to a degree of protrusion of the first material layers 241a and 241b of the second interlayer insulating layer 240. For example, the protrusion of the first material layers 141a and 141b of the second interlayer insulating layer 140 is increased, the size of the void V may be increased. That is, according to a width of the oxide layer 250 and a degree of etching of the portion of the oxide layer 250. The spacer material 260 may include, for example, a nitride.

Figure 11:
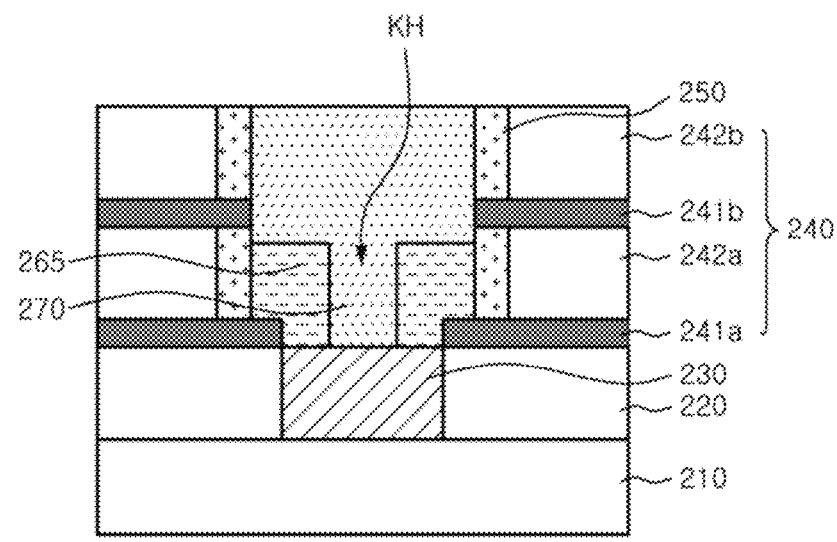

As illustrated in FIG. 11, the spacer material 260 may be etched to a certain height inside of the resistance change region H to form a spacer 265. When a portion of the spacer material 260 is etched, an etching gas, for example $CH_3F$ gas and $O_2$ plasma gas may be used. The etching gas may be transferred into the void V and the spacer material 260 below the void V is also etched to form a key hole KH exposing the lower electrode 230. A variable resistance material 270 may be formed in the insides of the key hole KH and the resistance change region H. The variable resistance material 270 may include, for example, $Ge_2Sb_2Te_5$ (GST).

Figure 12:
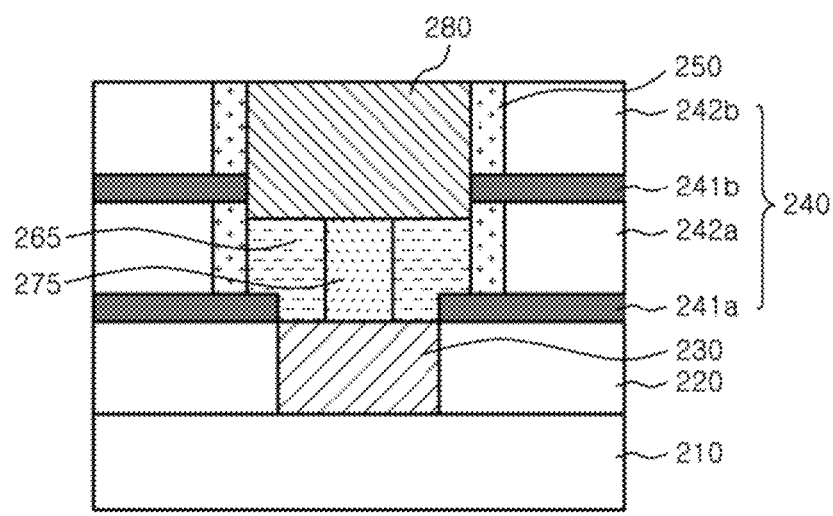

As illustrated in FIG. 12, the variable resistance material 270 may be etched so as to remain only in the key hole KH to form a variable resistance layer 275. An upper electrode 280 may be formed on the variable resistance layer 270 by forming a conductive material in the resistance change region H.

In the variable resistance memory devices according to implementations of the inventive concept, since the lower electrode 130 and 230 and the variable resistance layer 170 and 270 are in contact with each other through the key hole KH, a contact area is reduced, and thus a reset current can be reduced.

The above implementation of the present invention is illustrative and not limitative. Various alternatives and equivalents are possible. The invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor integrated circuit device, the method comprising:
   forming a multi-layered structure by alternately forming a first layer and a second layer on a semiconductor substrate;
   forming a first hole in the multi-layered structure by etching a portion of the multilayered structure, the first hole including a sidewall with protruding portions; and
   forming a spacer in a lower portion of the first hole, thereby defining a second hole by the spacer,
   wherein the protruding portions of the sidewall of the first hole are formed by selectively oxidizing the second layer and removing an oxidized portion of the second layer.

2. The method of claim 1, wherein the second layer has an etching selectivity being different from that of the first layer.

3. The method of claim 1, wherein the first layer includes a nitride material and the second layer includes a polysilicon material.

4. The method of claim 1, further comprising: after the forming a first hole and before the forming the spacer,
   forming an oxide layer along an inner sidewall of the first hole.

5. The method of claim 4, wherein the oxide layer is formed by an atomic layer deposition (ALD).

6. The method of claim 1, wherein the forming the spacer includes:
   filing the first hole with a spacer material; and
   etching the spacer material thereby defining the second hole;
   wherein the spacer material is formed to include a void when the spacer material is formed, the void formed due to the protruding portions, and the protruding portions are removed when the spacer is etched.

7. The method of claim 1, wherein the semiconductor substrate includes a lower electrode and the lower electrode is exposed by the first and second holes.

8. The method of claim 7, further comprising:
   filling a variable resistance material in the first and second holes, the filed in variable resistance material in direct contact with the lower electrode; and
   etching the variable resistance material to form a variable resistance layer within the second hole, as a remaining portion of the variable resistance material, which variable resistance layer remains in contact with the lower electrode.

9. The method of claim 8, further comprising:
   forming an upper electrode in the first hole.

* * * * *